(12) United States Patent
Rodney et al.

(10) Patent No.: US 7,301,223 B2
(45) Date of Patent: Nov. 27, 2007

(54) HIGH TEMPERATURE ELECTRONIC DEVICES

(75) Inventors: Paul F. Rodney, Houston, TX (US); James E. Masino, Houston, TX (US); Christopher A. Golla, Houston, TX (US); Roger L. Schultz, Aubrey, TX (US); James J. Freeman, Houston, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 167 days.

(21) Appl. No.: 10/992,145

(22) Filed: Nov. 18, 2004

(65) Prior Publication Data

US 2005/0104176 A1 May 19, 2005

Related U.S. Application Data

(60) Provisional application No. 60/520,992, filed on Nov. 18, 2003, provisional application No. 60/520,950, filed on Nov. 18, 2003.

(51) Int. Cl.
*H01L 23/58* (2006.01)
*H01L 21/00* (2006.01)

(52) U.S. Cl. .................. 257/629; 257/633; 438/105; 438/127

(58) Field of Classification Search .......... 257/77, 257/414, 467, 469, 629, 633; 438/48, 105, 438/778, 787, 791, 106, 125, 127
See application file for complete search history.

(56) References Cited

U.S. PATENT DOCUMENTS

| | | | |
|---|---|---|---|
| 4,053,916 A | 10/1977 | Cricchi et al. | |
| 4,724,530 A | 2/1988 | Dingwall | |
| 4,803,178 A | 2/1989 | McCaughan | |
| 4,922,315 A | 5/1990 | Vu | |
| 5,041,975 A | 8/1991 | Minerbo et al. | |
| 5,146,299 A | 9/1992 | Lampe et al. | |
| 5,374,567 A | 12/1994 | Cartagena | |
| 5,416,043 A | 5/1995 | Burgener et al. | |
| 5,541,432 A | 7/1996 | Tsuji | |
| 5,627,092 A | 5/1997 | Alsmeier et al. | |
| 5,869,868 A | 2/1999 | Rajeevakumar | |
| 5,991,602 A | 11/1999 | Sturm | |
| 6,324,904 B1 * | 12/2001 | Ishikawa et al. | 73/152.03 |
| 6,424,011 B1 | 7/2002 | Assaderaghi et al. | |
| 6,443,228 B1 | 9/2002 | Aronstam et al. | |
| 6,472,702 B1 | 10/2002 | Shen | |
| 6,627,954 B1 | 9/2003 | Seefeldt | |
| 6,800,933 B1 * | 10/2004 | Mathews et al. | 257/712 |
| 6,838,741 B2 * | 1/2005 | Sandvik et al. | 257/438 |

(Continued)

FOREIGN PATENT DOCUMENTS

WO    WO 03/096073 A1    11/2003

*Primary Examiner*—Tuan H. Nguyen
(74) *Attorney, Agent, or Firm*—Krueger Iselin LLP; Daniel J. Krueger

(57) ABSTRACT

In at least some embodiments, electronic devices suitable for use at temperatures in excess of 200 C. may comprise an integrated circuit fabricated on a silicon carbide substrate, and a thick passivation layer. In other embodiments, electronic devices suitable for use at temperatures in excess of 200 C. may comprise an integrated circuit formed from silicon located on a sapphire substrate, and a thick passivation layer. The electronic devices may be implemented in the context of hydrocarbon drilling and production operations.

54 Claims, 10 Drawing Sheets

U.S. PATENT DOCUMENTS

| | | |
|---|---|---|
| 6,881,606 B2 * | 4/2005 | Jiang et al. ............... 438/106 |
| 7,088,964 B2 * | 8/2006 | O ............................ 455/90.3 |
| 7,145,211 B2 * | 12/2006 | Mallikarjunaswamy et al. ....................... 257/409 |
| 2001/0055838 A1 | 12/2001 | Walker et al. |
| 2002/0004932 A1 * | 1/2002 | Shau ........................ 716/19 |
| 2004/0026785 A1 * | 2/2004 | Tomita ..................... 257/758 |
| 2004/0122764 A1 * | 6/2004 | Stokes et al. ............. 205/782 |
| 2004/0204013 A1 * | 10/2004 | Ma et al. ................. 455/550.1 |
| 2006/0261490 A1 * | 11/2006 | Su et al. ................... 257/775 |

* cited by examiner

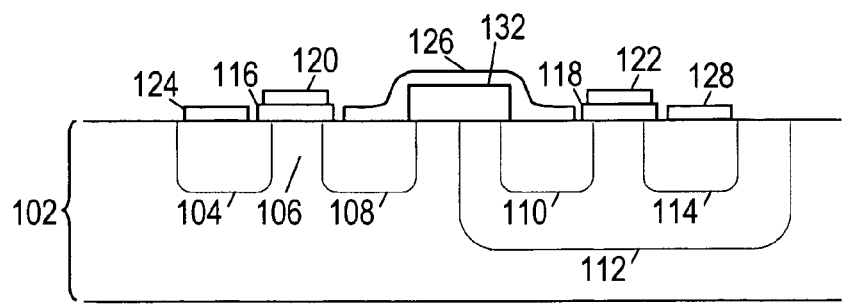
FIG. 2A
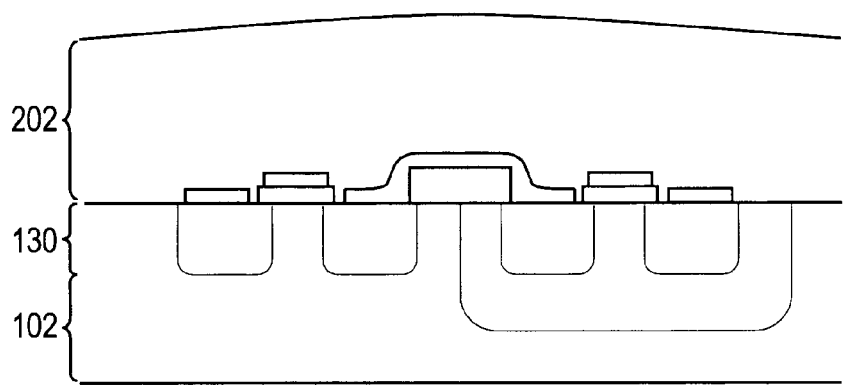
FIG. 2B
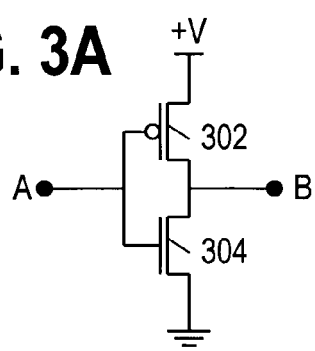
FIG. 3A
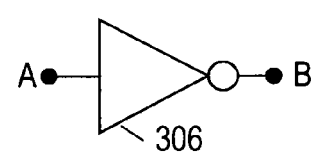
FIG. 3B
FIG. 4
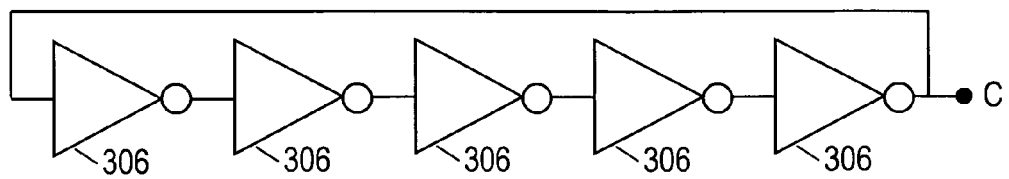

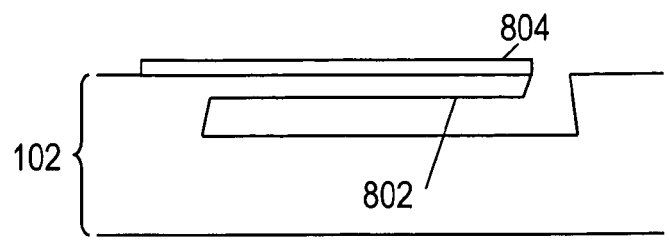
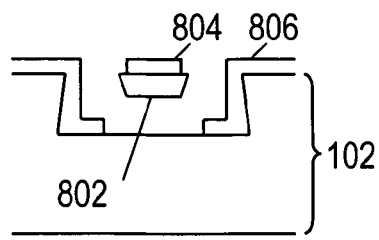
FIG. 8A  FIG. 8B
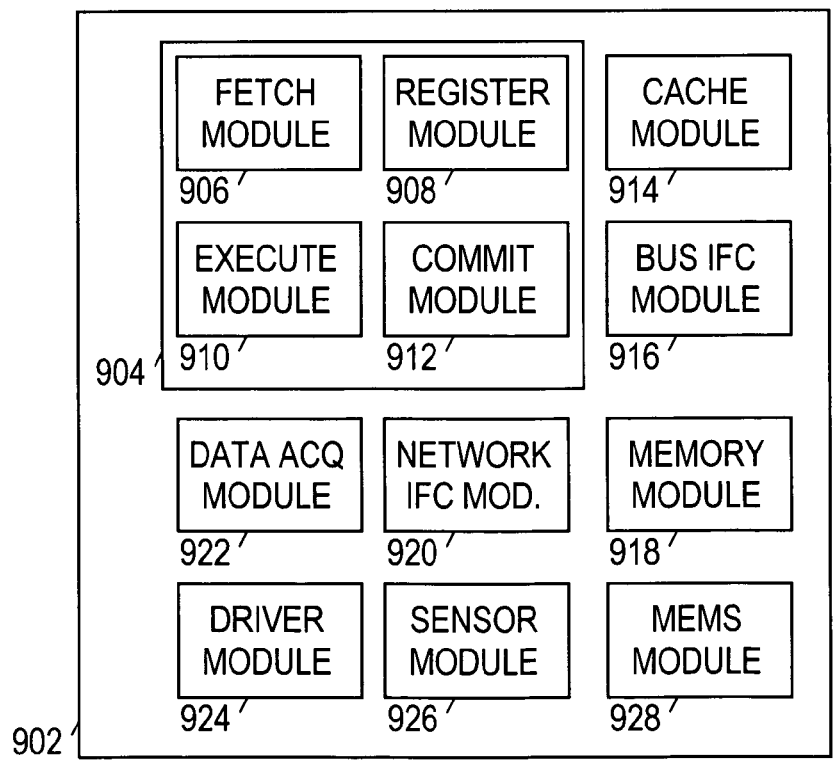
FIG. 9

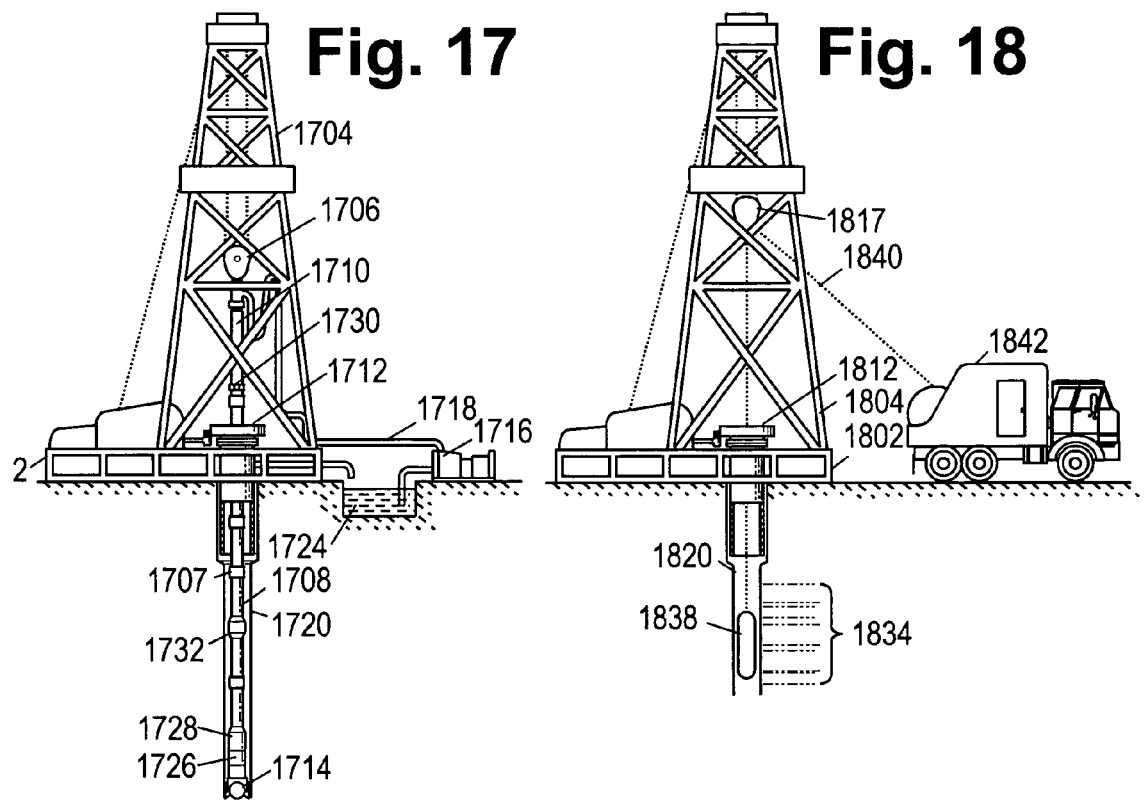
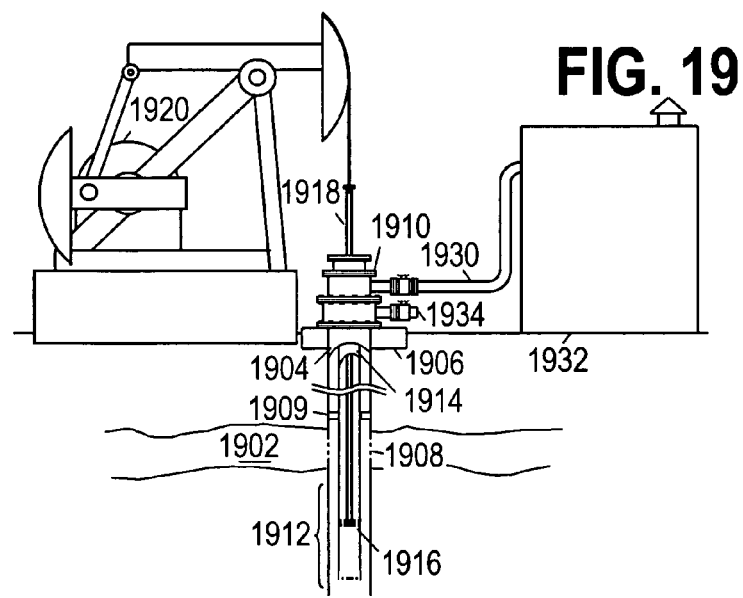

HIGH TEMPERATURE ELECTRONIC DEVICES

CROSS-REFERENCE TO RELATED APPLICATIONS

This application is a non-provisional application claiming priority to provisional application Ser. No. 60/520,992, filed on Nov. 18, 2003, entitled "High Temperature Electronics Suitable For Downhole Use," and provisional application Ser. No. 60/520,950, filed on Nov. 18, 2003, entitled "High Temperature SIC Electronics Suitable For Downhole Use, High Temperature SIC Circuits, And Receiver SIC Electronics Proximate Antenna," both of which are hereby incorporated by reference.

STATEMENT REGARDING FEDERALLY SPONSORED RESEARCH OR DEVELOPMENT

Not applicable.

BACKGROUND

Modern petroleum drilling and production operations demand a great quantity of information relating to parameters and conditions downhole. Such information typically includes characteristics of the earth formations traversed by the borehole, along with data relating to the size and configuration of the borehole itself. The collection of information relating to conditions downhole, which commonly is referred to as "logging", can be performed by several methods.

In conventional wireline logging, a probe (or "sonde") containing formation sensors is lowered into the borehole after some or all of the well has been drilled. The formation sensors are used to determine certain characteristics of the formations traversed by the borehole. The upper end of the sonde is attached to a conductive wireline that suspends the sonde in the borehole. Power is transmitted to the instruments in the sonde through the conductive wireline. Conversely, the instruments in the sonde communicate information to the surface using electrical signals transmitted through the wireline.

An alternative method of logging is the collection of data during the drilling process. Collecting and processing data during the drilling process eliminates the necessity of removing the drilling assembly to insert a wireline logging tool. It consequently allows the driller to make accurate modifications or corrections as needed to optimize performance while minimizing down time. "Measurement-while-drilling" (MWD) is the term for measuring conditions downhole concerning the movement and location of the drilling assembly while the drilling continues. "Logging-while-drilling" (LWD) is the term for similar techniques, which concentrate more on the measurement of formation parameters. While distinctions between MWD and LWD may exist, the terms MWD and LWD often are used interchangeably. For the purposes of this disclosure, the term LWD will be used with the understanding that this term encompasses both the collection of formation parameters and the collection of information relating to the movement and position of the drilling assembly.

In LWD systems, sensors typically are located at the lower end of the drill string. More specifically, the downhole sensors are typically positioned in a cylindrical drill collar positioned near the drill bit. While drilling is in progress these sensors continuously or intermittently monitor predetermined drilling parameters and formation data and transmit the information to a surface detector by some form of telemetry. Alternatively, the data can be stored while the sensors are downhole, and recovered at the surface later when the drill string is retrieved.

Once drilling on a well has been completed, the well may be used for production of hydrocarbons. The well bore may be lined with casing to prevent collapse. The casing may be perforated in certain regions to permit hydrocarbons to enter the well bore from the formation. A string of production tubing may be lowered through the casing to where the hydrocarbons are entering the well bore. Particularly in the situation where the casing is perforated at multiple levels or positions (in the case of a horizontal well), instruments may be attached to the production tubing to determine the location, type and amount of hydrocarbons that enter the well bore. The instruments may additionally be configured to perform control operations to limit or enhance flows in selected regions of the well bore.

In addition, or alternatively, completed wells may be used for seismic data gathering and long term reservoir monitoring. Typically, an array of sensors is disposed along the length of a well and fixed in place. A telemetry system gathers the sensor data into a central (surface) facility where the data may be processed to extract desired information.

As drilling technology improves, deeper wells are drilled. Pressures and temperatures become significantly higher at greater well depths. At temperatures approaching 200 Celsius, the performance of existing electronic technologies degrades or fails. It would be desirable to create data acquisition systems that are suitable for use at temperatures approaching and well in excess of 200 C.

SUMMARY

In some embodiments, electronic devices operable at elevated temperatures may comprise an integrated circuit fabricated on a silicon carbide substrate. Each electronic device may further comprise a thick passivation layer. In alternative embodiments, electronic devices operable at elevated temperatures may comprise an integrated circuit fabricated on a sapphire substrate, and a thick passivation layer. The integrated circuits may include oscillators, logic gates, analog-to-digital converters, digital-to-analog converters, sample and hold circuits, charge-coupled delay lines and operational amplifiers. The electronic devices may be configured for use in units that sense, store, and process data in high temperature environments for an extended period of time. The electronic devices may be configured for use with hydrocarbon drilling and production operations.

BRIEF DESCRIPTION OF THE DRAWINGS

A better understanding of the disclosed embodiments can be obtained when the following detailed description is considered in conjunction with the following drawings, in which:

FIG. 2A shows an illustrative physical SiC structure;

FIG. 2B shows an illustrative SiC structure with a thick passivation layer;

FIGS. 3A and 3B show an electrical schematic of a CMOS inverter;

FIG. 4 shows an illustrative inverter ring oscillator;

FIGS. 8A and 8B show an illustrative MEMS device;

FIG. 9 shows a partitioned device;

FIG. 17 shows a representative logging-while-drilling (LWD) configuration;

FIG. 18 shows a representative wireline-logging configuration;

FIG. 19 shows an illustrative well during production operations;

Figure 1A:
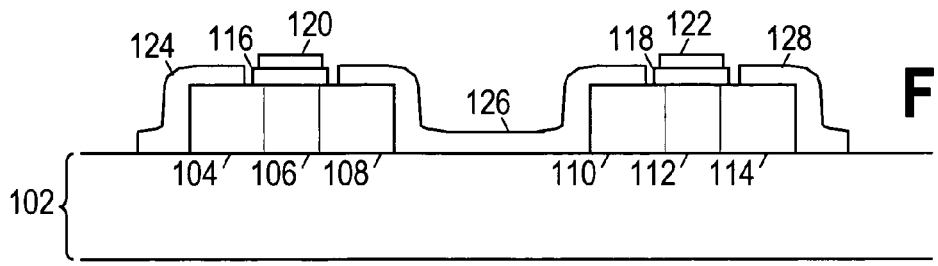
FIGS. 1A and 1B show illustrative physical SOS structures.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

NOTATION AND NOMENCLATURE

Certain terms are used throughout the following description and claims to refer to particular system components and configurations. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". Also, the term "couple" or "couples" is intended to mean either an indirect or direct electrical connection. Thus, if a first device couples to a second device, that connection may be through a direct electrical connection, or through an indirect electrical connection via other devices and connections. The terms upstream and downstream refer generally, in the context of this disclosure, to the transmission of information from subsurface equipment to surface equipment, and from surface equipment to subsurface equipment, respectively. Additionally, the terms surface and subsurface are relative terms. The fact that a particular piece of hardware is described as being on the surface does not necessarily mean it must be physically above the surface of the earth; but rather, describes only the relative placement of the surface and subsurface pieces of equipment.

DETAILED DESCRIPTION

Embodiments of the invention provide fundamental electronic circuits that are capable of operating in high temperature environments. In at least some embodiments, the electronic circuits may be formed as integrated circuits fabricated on a silicon carbide (SiC) substrate. Alternatively, the electronic circuits may be formed as integrated circuits fabricated on a sapphire substrate (referred to herein as silicon on sapphire or SOS technology). The electronic circuits may include oscillators, logic gates, analog-to-digital converters, digital-to-analog converters, sample and hold circuits, charge-coupled delay lines and operational amplifiers. Also, a variety of techniques may be employed to reduce negative effects (e.g., electromigration, leakage current, material degradation) that high temperatures may have on the electronic circuits. For example, the integrated circuit embodiments described above may employ a thick passivation layer, guard rings around sensitive circuitry, seal rings that reduce metallic corrosion, and metallic interconnects that reduce current density. The electronic circuits also may be used as building blocks for electronic devices such as memories and processors that are operable in high temperatures for an extended period of time (e.g., more than one week).

In at least some embodiments, the electronic circuits and electronic devices may be configured for use in a tool such as a drilling tool thereby permitting the tool to operate in a high temperature environment. For example, the electronic circuits may function to sense parameters (e.g., temperature, vibration, acceleration) associated with the tool or the environment as well as provide processing, storage, and data transmission capabilities in the high temperature environment.

Turning now to the figures, FIG. 1A shows an illustrative cross-section of a complementary metal-oxide-semiconductor (CMOS) inverter constructed using a SOS technology. The inverter includes two transistors, each constructed as an isolated island on a sapphire substrate 102. The first transistor includes a p-doped region 106 of silicon between two $n^+$-doped regions 104, 108. The second transistor includes an n-doped region 112 between two $p^+$-doped regions 110, 114. Regions 106 and 112 are the active regions, and are each separated by corresponding insulating oxide layers 116, 118 from corresponding gate electrodes 120, 122. When a positive voltage is applied to gate 120, a channel forms in active region 106, thereby electrically coupling electrode 124 to center electrode 126. A similar voltage applied to gate 122 eliminates the channel in region 112, thereby isolating the center electrode 126 from electrode 128. Conversely, when the positive voltage is removed from gates 120 and 122, the channel in region 106 disappears, while the channel in region 112 is re-established. The center electrode 126 is thus isolated from electrode 124 and coupled to electrode 128. If electrode 124 is coupled to ground, and electrode 128 is coupled to a positive supply voltage, the voltage driven to center electrode 126 is the digital inverse of the voltage on the gate electrodes.

Note that these and other cross-sectional views of integrated circuits are not drawn to scale. Typically, the wafer substrate is about 1 mm thick, while the semiconducting layer may (for example) be 10-8 to 10-4 m thick. The thickness of the conducting layers may be around 10-100 nm thick.

By creating the transistors as islands on an insulating substrate, stray leakage paths are eliminated. Such current leakage paths are a primary source of performance degradation or failure at elevated temperatures, and their elimination allows operation at temperatures much higher than would otherwise be possible.

Figure 1B:
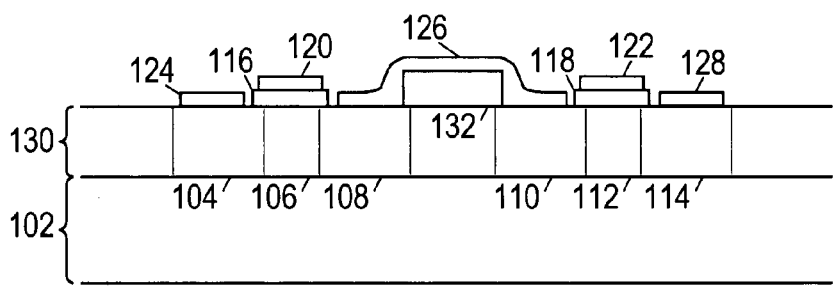

FIG. 1B shows a illustrative cross-section of a CMOS inverter using a different SOS technology. In this approach, a semiconducting layer 130 is present across the surface of the sapphire substrate 102. The transistors are formed in much the same manner as before, but rather than being isolated islands, they are spaced apart within the thin semiconducting layer 130. Conductors interconnecting the transistors (such as center electrode 132) must now be separated from the intermediate regions of the semiconducting layer by thick insulating layers 132 to avoid creating undesired channels and current leakage paths. Nevertheless, the performance of devices in this SOS technology is still significantly improved relative to devices on bulk silicon due to the elimination of leakage paths in the substrate. In addition, the performance may be further enhanced through the use of trenches, guard rings, and other structures to reduce or eliminate leakage through the semiconducting layer 130. (Guard rings are conductive structures around sensitive areas. The structures are held at or near the same potential as the sensitive areas to reduce the electric field gradient, thereby reducing leakage currents).

Electronics that operate at elevated temperatures may be designed to counter environmental effects (besides leakage current) caused by the elevated temperature. For example, electronics packages disposed indefinitely in an elevated temperature environment may be expected to encounter "outgassing" effects. Outgassing is an emission of chemical vapors from materials used to construct the electronics package. For example, plastics and adhesives may contain residual solvents that evaporate at elevated temperatures. Other materials may begin (slowly) decomposing. It is not uncommon for corrosive and exotic chemical species to form. Integrated circuits may be particularly susceptible to degradation if not adequately protected.

Figure 1C:
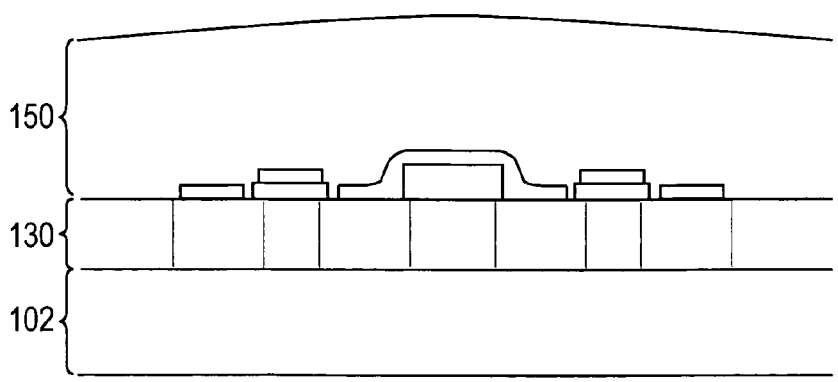
FIG. 1C shows an illustrative SOS structure with a thick passivation layer.

FIG. 1C shows one form of protection: a thick passivation layer 150 disposed over the active surface of the integrated circuit die. The passivation layer may be an oxide or nitride material. In one implementation, the passivation layer comprises about 5000 angstroms of phosphorus-doped $SiO_2$, overlaid with about 15000 angstroms of $Si_3N_4$. Thus the thick passivation layer is at least 2 microns (approximately) or more in thickness. For long term use in elevated temperature environments, it may be desirable to increase the passivation layer thickness up to about 6 microns.

Figure 22:
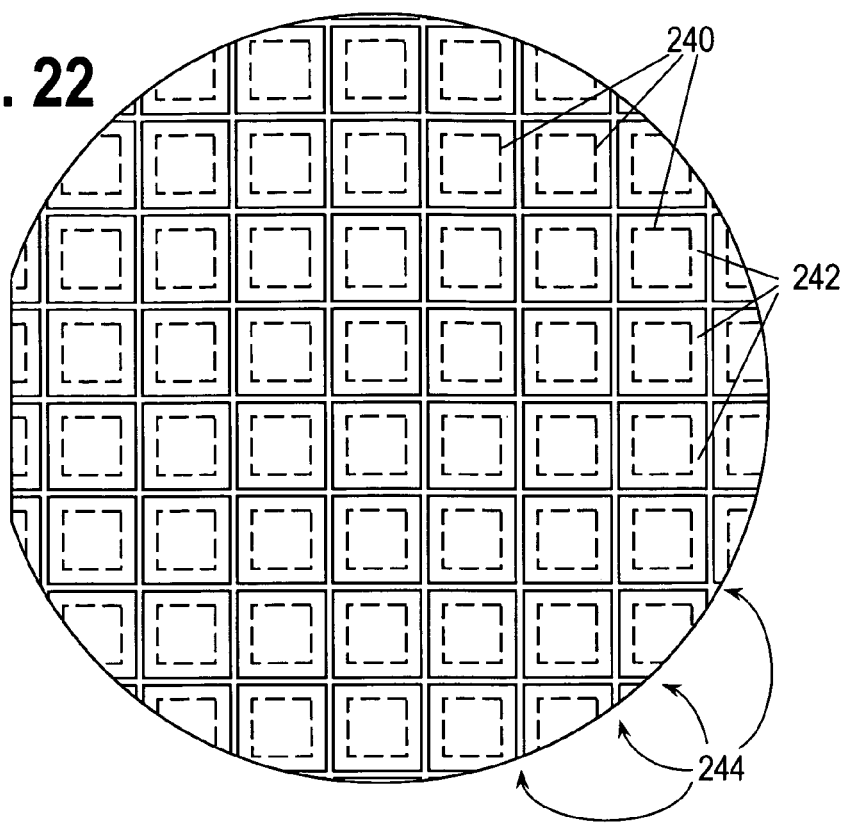
FIG. 22 shows an illustrative wafer layout.

FIG. 22 shows another form of protection: a wide seal ring 242 around each die. As shown in FIG. 22, many integrated circuits 240 are fabricated on each wafer. After fabrication, a saw cuts the wafer along the cutting lanes 244 to form integrated circuit dies. (An adhesive backing material may be used to hold the dies in place during the cutting operation.) The cutting operation often distresses the edges of the integrated circuit die, e.g., by causing chipping, small fractures, and/or fatiguing of the bond between the passivation layer and the wafer substrate. Each of these distress features may increase the die's vulnerability to degradation from outgassing effects. Accordingly, a wide seal ring may be provided to increase the bonding area and to increase the separation of the integrated circuitry from the distressed edges caused by wafer singulation placed on an adhesive strip (to hold the dies in place). In one embodiment, the seal ring width is at least twice the width of the cutting lanes 244.

FIG. 2A shows an illustrative cross-section of a complementary metal-oxide-semiconductor (CMOS) inverter constructed using a SiC technology. The inverter includes two transistors, fabricated on the surface of silicon carbide substrate 102. The first transistor includes a p-doped region 106 of silicon carbide between two $n^+$-doped regions 104, 108. The second transistor includes an n-doped region 112 between two $p^+$-doped regions 110, 114. Regions 106 and 112 are the active regions, and are each separated by corresponding insulating oxide layers 116, 118 from corresponding gate electrodes 120, 122. When a positive voltage is applied to gate 120, a channel forms in active region 106, thereby electrically coupling electrode 124 to center electrode 126. A similar voltage applied to gate 122 eliminates the channel in region 112, thereby isolating the center electrode 126 from electrode 128. Conversely, when the positive voltage is removed from gates 120 and 122, the channel in region 106 disappears, while the channel in region 112 is re-established. The center electrode 126 is thus isolated from electrode 124 and coupled to electrode 128. If electrode 124 is coupled to ground, and electrode 128 is coupled to a positive supply voltage, the voltage driven to center electrode 126 is the digital inverse of the voltage on the gate electrodes.

Note that these and other cross-sectional views of integrated circuits are not drawn to scale. Typically, the wafer substrate is about 1 mm thick, while the diffusion-doped regions may (for example) be $10^{-8}$ to $10^{-4}$ m thick. The thickness of the conducting layers may be around 10-100 nm thick, and the thickness of the insulating layers may range from a few nanometers to a few micrometers.

The large energy band gap of silicon carbide reduces leakage currents and allows for integrated circuit operation at higher temperatures than silicon. In addition, the performance may be further enhanced through the use of trenches, guard rings (i.e., conductive structures around sensitive areas), and other structures to further reduce or eliminate leakage currents. The structures are held at or near the same potential as the sensitive areas to reduce the electric field gradient, thereby reducing leakage currents).

FIG. 2B shows the SiC device of FIG. 2A with a thick passivation layer 202 disposed over the active surface of the integrated circuit die to provide protection against outgassing-induced degradation. The passivation layer may be an oxide or nitride material. In one implementation, the passivation layer comprises about 5000 angstroms of phosphorus-doped $SiO_2$, overlaid with about 15000 angstroms of $Si_3N_4$. Thus the thick passivation layer is at least 2 microns (approximately) or more in thickness. For long term use in elevated temperature environments, it may be desirable to increase the passivation layer thickness up to about 6 microns. Seal rings may also be employed to provide enhanced protection against degradation from outgassing effects.

Another environmental effect at elevated temperatures is enhanced electromigration. Electromigration is the movement of metal atoms caused by the flow of electrons. Electromigration can lead to the thinning and separation of interconnections within an integrated circuit. One form of protection against electromigration is limited current densities. The integrated circuits may be designed to operate on lower currents (e.g., more slowly), or the interconnects may be designed with larger cross-sectional areas to reduce the current density. In some embodiments, the integrated circuit may implement metal interconnects that limit current density to below a predetermined level even when the integrated circuit operates at an elevated temperature (above 200 Celsius). In conventional circuits, electromigration in metal interconnections has been observed at current densities above $10^5$ A/cm². This value can be expected to drop at higher temperatures, and may depend on the metal or alloy used to fabricate the interconnections. Nevertheless, establishing a current density limit in the range $5 \times 10^3$ A/cm$^2$ to $5 \times 10^4$ A/cm$^2$ can be expected to eliminate electromigration as a cause of performance degradation or device failure. To limit current densities, the integrated circuits may be designed to operate on lower currents (e.g., more slowly), or the interconnects may be designed with larger cross-sectional areas. For example, the interconnects may be fabricated two to five times wider and two to three times thicker than conventional interconnects to reduce current densities.

FIG. 3A shows an electrical schematic of a CMOS inverter which may be implemented using SiC or SOS technology. The inverter comprises two transistors 302, 304. Transistor 302 is a MOS transistor with a p-type active region (PMOS), and transistor 304 is a MOS transistor with a n-type active region (NMOS). This transistor configuration drives the digital inverse of the voltage at node A onto node B. FIG. 3B shows the electrical symbol 306 for an inverter.

FIG. 4 shows an example of an inverter ring oscillator. The oscillator is built using an odd number of inverters 306 in series. Applying power to the series produces an oscillating signal at node C. The inverters may be designed to be temperature sensitive, or alternatively they may be augmented with temperature sensitive components between the inverters. In such a design, the oscillation frequency is temperature sensitive, allowing the inverter ring may be used as a temperature sensor. In the drill bit context (FIG. 16), the oscillating sensor signal may be received from sensor 1616 and wirelessly transmitted by telemetry package 1618. Alternatively, the sensor may be coupled directly to an antenna to transmit the oscillating signal without intervention. In other embodiments, the inverter ring may be designed to be sensitive to a parameter other than temperature.

Inverter ring sensors may be simple and robust. However, they may be unsuitable as high-precision sensors. For high-precision sensing, digital data acquisition and processing may be preferred. The ingredients of a digital data acquisition circuit typically include a voltage reference, a sample and hold circuit, and an analog-to-digital converter (ADC). A charge-coupled delay line and a digital memory may also prove useful. In the following discussion, examples are provided of various constructions of selected components.

Figure 5:
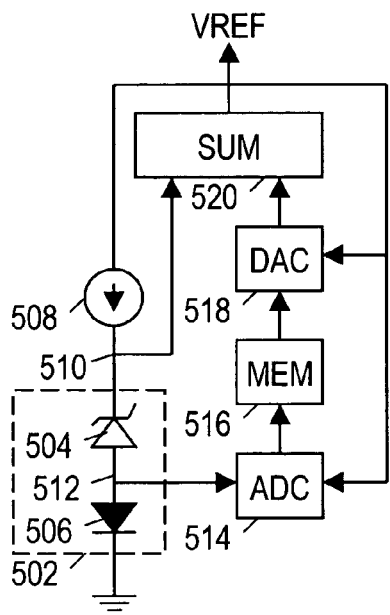
FIG. 5 shows an illustrative high-precision temperature compensated voltage reference.

FIG. 5 shows a high-accuracy temperature-compensated voltage reference suitable for use at elevated temperatures. The voltage reference may be suitable for use by geothermal tools, smart transducer interface node telemetry (STINT) systems, wireline logging tools, MWD tools, and any tools used in a high temperature environment that employ analog-to-digital conversion. The voltage reference includes a first order voltage reference source 502 such as a band-gap circuit or a temperature compensated Zener diode. Both of the examples given include temperature-compensation components with a positive temperature coefficient to compensate a negative temperature coefficient elsewhere in the first order reference source. Tapping this component allows for determination of a temperature-indicative voltage.

The first order voltage reference source 502 in FIG. 5 is a temperature compensated Zener diode source, having a Zener diode 504 in series with a forward-biased diode 506. (The voltage across the diode serves as our temperature-indicative voltage.) A current source 508, when applied to the first order source 502, generates a first-order voltage reference at node 510. An analog-to-digital converter (ADC) 514 samples the temperature indicative voltage from node 512 and digitizes the value, preferably with 16 bits of resolution. The digital value is supplied as an address to a nonvolatile memory 516. The memory 516 is filled with compensation values determined during a calibration process at product deployment. The compensation value for the measured temperature-indicative voltage is supplied to a digital-to-analog converter (DAC) 518 which generates an analog compensation voltage. (Again, 16 bits of precision may be preferred.) A summation circuit 520 generates the high-precision voltage reference from the first-order voltage reference and the compensation voltage. The high-precision reference voltage may be used to drive the current source 508, and may serve as a reference for the ADC 514 and DAC 518.

Figure 6:
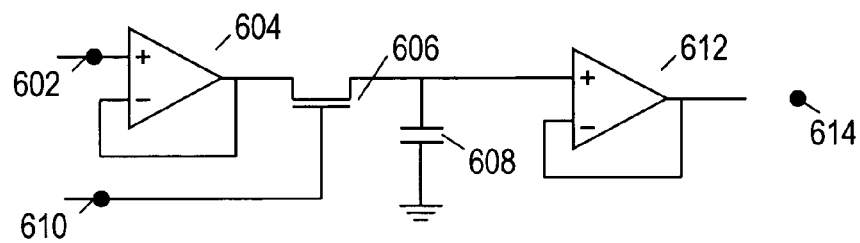
FIG. 6 shows an illustrative sample and hold circuit.

FIG. 6 shows an example of a sample and hold circuit. When implemented using SiC technology, the performance of the sample and hold circuit is expected to be significantly better than the performance of comparable silicon circuits due to the inherently low leakage currents present in SiC circuits.

An input signal voltage at node 602 is buffered by an operational amplifier 604. A gate signal supplied to node 610 switches a gate transistor 606 between "open" and "closed" states. When the gate transistor 606 is in a conductive state, the operational amplifier 604 drives the buffered voltage onto capacitor 608. When the gate transistor is nonconductive, the capacitor voltage 608 is frozen, i.e., the sampled input voltage is "held." Capacitor 608 may be an on-chip capacitor, or for extended hold applications, capacitor 608 may be an on-chip capacitor connected in parallel with an off-chip capacitor. Another operational amplifier 612 buffers the capacitor voltage, supplying an output signal node 614 with a voltage indicative of the capacitor voltage.

Figure 7A:
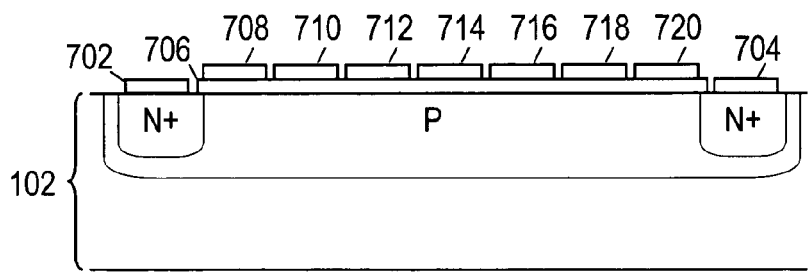
FIGS. 7A and 7B show illustrative charge coupled delay lines.

FIG. 7A shows a charge coupled delay line implemented using SiC technology. A SiC wafer 102 is provided with a device structure having terminal regions of n+ doped silicon carbide around an active region of p-doped silicon carbide. A "loading" electrode 702 is coupled to one terminal region, and an "unloading" electrode 704 is coupled to the other terminal region. Between the terminal regions is a series of gates 708-720 separated from the active region by a gate insulator 706. When driven in the appropriate sequence, a charge (indicative of the current supplied to the loading electrode) is passed from gate to gate and eventually delivered to the unloading electrode, where the charge can be measured. The driving sequence can be controlled to generate programmable delays. An illustrative driving sequence is shown in the following table, in which "B" represents a buffer voltage (e.g., 5 volts) at which the charge held underneath a gate is negligible, "H" represents a hold voltage (e.g., 10 volts) at which charge is stored underneath a gate, and "P" represents a pass voltage (e.g., 15 volts) at which charge is pulled from underneath adjacent gates.

| Time | gate 708 | gate 710 | gate 712 | gate 714 | gate 716 | gate 718 | gate 720 |
|---|---|---|---|---|---|---|---|
| 1 | H | P | B | H | P | B | B |
| 2 | B | P | B | B | P | B | B |
| 3 | B | H | B | B | H | B | B |
| 4 | B | H | P | B | H | P | B |
| 5 | B | B | P | B | B | P | B |
| 6 | B | B | H | B | B | H | B |
| 7 | B | B | H | P | B | H | H |
| 8 | B | B | B | P | B | B | H |
| 9 | B | B | B | H | B | B | B |
| 1 (rpts) | H | P | B | H | P | B | B |

Each gate (except the ones adjacent to the terminal regions) goes through a nine-step sequence of voltages to draw charge from a preceding gate, hold the charge momentarily, pass the charge on to the next gate, and act as a buffer while the preceding gate gathers a charge. The gates adjacent the terminals may operate as valves, never drawing a charge, but simply allowing the charge to pass to (or from) the terminal electrodes.

The charge coupled delay line can operate at very high frequencies, e.g. the control sequence may be clocked at radio frequencies without significantly impairing performance. At the other extreme, the charge coupled delay can operate at very low frequencies. The control sequence may even be halted indefinitely at steps 3, 6 or 9 to store charge in the delay line. This configuration allows the delay line to be used as a low-complexity analog memory. Thus, for example, a low complexity sensor may include a transducer, a simple amplifier, and a suitably clocked delay line which stores a sequence of measurements made by the transducer. The sensor may then be physically transported to a central installation where the measurements are recovered, converted to digital values, and subjected to customary digital signal processing thereafter.

Figure 7B:
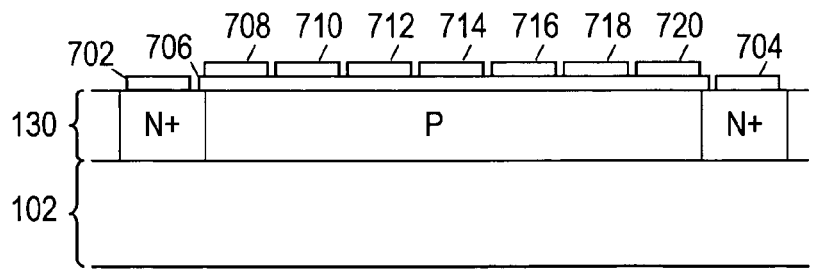

FIG. 7B shows a charge coupled delay line implemented using SOS technology. A sapphire wafer 102 is provided with a semiconducting layer 130 having terminal regions of n+ doped silicon around an active region of p-doped silicon. A "loading" electrode 702 is coupled to one terminal region, and an "unloading" electrode 704 is coupled to the other terminal region. Between the terminal regions is a series of gates 708-720 separated from the active region by a gate insulator 706. The operation of the charge coupled delay line of FIG. 7B is the same as, or is similar to, the operation of the charge coupled delay line described above for FIG. 7A.

Micro electromechanical systems (MEMS) technology may be implemented using SiC or SOS technology. FIGS. 8A and 8B show an example of a cantilever which may be used as an acceleration or vibration sensor. The surface of the sapphire wafer 102 may be patterned and chemically etched to create a cantilever 802 having a top electrode 804. FIG. 8A shows a side view, while FIG. 8B shows an "end-on" view of the cantilever structure. In FIG. 8B, the side-wall electrodes 806 are shown. When the device is subjected to acceleration, the cantilever 802 deflects slightly. The deflection may be detected as a change in capacitance between the top electrode 804 and the side electrodes 806. Various construction techniques and sensor structures are described for bulk silicon in Julian W. Gardner, et al., *Microsensors, MEMS and Smart Devices,* © 2001 Wiley & Sons, which is hereby incorporated by reference. In addition to accelerometers, MEMS techniques may be applied to fabricate pressure sensors, gyros, temperature sensors, thermal arrays, etc. The sensor configuration may be based on (among other examples): rotational motion detection, torsional force detection, lateral or vertical cantilever configurations, and capactive, inductive, resistive, and optical transducers.

SiC and SOS technology offers a performance advantage at high temperatures. However, as a new technology, SiC and SOS dies may suffer from relatively high numbers of fabrication defects. In other words, the defect densities may be high enough to make fabricating large, complex integrated circuits infeasible. The yield rate (the fraction of fabricated devices that function properly) is strongly dependent on the size of the integrated circuit die. Large die size virtually guarantees the presence of a defect on each die, drastically reducing the yield rate. Existing SiC and SOS fabrication techniques may provide acceptable yield rates if the die size is strictly limited. Given such yield rate restrictions, complex circuits such as high-performance processors and computers may only be feasible as partitioned designs, i.e., designs partitioned so that each piece can fit on a die of a predetermined size and so that the overall design can be constructed by piecing together functional die into a hybrid circuit (such as a multi-chip module).

FIG. 9 shows an illustrative partitioning to allow use of a fabrication technology to produce a complex electronics package 902 suitable for use in a high temperature environment. The package 902 may include a processor 904 that is partitioned into a fetch module 906 for retrieving instructions and data from memory, as well as data from registers, a register module 908 for storing intermediate calculation values, an execution module 910 for processing data in accordance with instructions, and a commit module 912 for storing results from the execution module in registers and memory. Each module may be on a separate die and coupled together to form processor 904. The package 902 may further include a cache module 914 for caching data and instructions requested by the processor, a bus interface module 916 for coupling the cache and processor to other system components, a memory module 918 for storing software and data, a network interface module 920 for coupling the package to external computer components, a data acquisition module 922 for controlling transducers and acquiring sensor data, a driver module 924 for powering actuators and transducers, a sensor module 926 for amplifying and detecting signals from sensors, and a micro electromechanical system (MEMS) module 928 for internal sensing of various parameters. Each module may be on a separate die and coupled together to form the electronics package 902.

Figure 23:
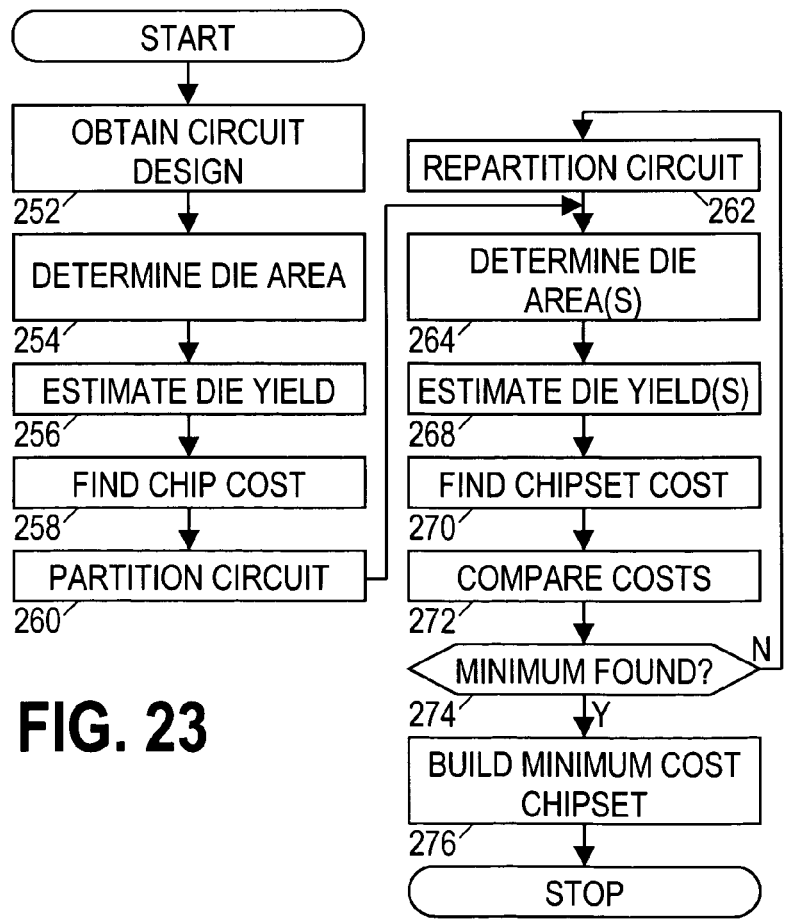
FIG. 23 shows an illustrative partitioning method.

FIG. 23 shows an illustrative method for determining the best partitioning of a large circuit. This method may embodied in a software program to be executed by a computer. In block 252, the original circuit design is obtained. Any one of the available integrated circuit layout specification languages may be used to represent the circuit design and to stored the circuit design in an electronic file. In block 252, the circuit design may be a pre-existing computer file that is accessed by the computer implementing this method. In block 254, the surface area required by the circuit design is determined. In block 256, the yield (i.e., the fraction of fabricated integrated circuits that are defect-free) is estimated based at least in part on the required surface area. In one embodiment, the yield Y may be estimated using Murphy's model:

$$Y = \left[\frac{1-e^{-AD}}{AD}\right]^2, \qquad (1)$$

where A is the circuit area that is sensitive to point defects, and D is the density for the point defects. Other yield models also exist and may be used.

In block 258, the cost for a packaged chip is calculated. The cost may include the processing cost for each wafer divided by the average number of defect-free dies per wafer, and may further include the packaging cost for a defect-free die. In blocks 260 through 272, the costs for chipsets with varying numbers of chips are determined. As the number of chips in a chipset increases, the total cost may drop, but will eventually increase without bound as the packaging costs become the dominating factor. Accordingly, operations performed in blocks 260 through 272 seek to identify the point at which the chipset cost is minimized. Note that the cost determined in block 258 can be the minimum cost, but this should not be expected when defect densities are high and the circuit design requires a relatively large area.

In block 260, the circuit design is partitioned into two circuits requiring a smaller active area. The partitioning operation attempts to circuit portions of relatively equal size, subject to the requirement that the portions be modular, i.e., that the portions have a limited number of interconnections. The limitation on the number of interconnections is imposed by the limited space available for connection pads on the die's surface. (Due to connection pad requirements, the total surface area for the partitioned circuit may be larger, but connection pads are largely insensitive to fabrication defects and thus will only minimally affect the yield calculation.)

In block 264, the area requirements for each circuit partition are determined. In block 268, the yield for each circuit partition are determined. In block 270, the cost for each chip is determined (as in block 258), and the costs are summed to determine the chipset cost. In block 272, the current cost is compared to the previous cost. If the current cost is higher, then the previous cost was the minimum chipset cost, and the circuit should be partitioned accordingly. Thus, control passes to block 276, where the optimally partitioned chipset is manufactured.

If the current cost is lower than the previous cost, then control passes from block 274 to block 262, where the circuit design is re-partitioned to obtain a chipset design with a greater number of chips. Blocks 262-274 are repeated until the costs start to rise, thereby indicating that the minimum cost has been identified.

Figure 10:
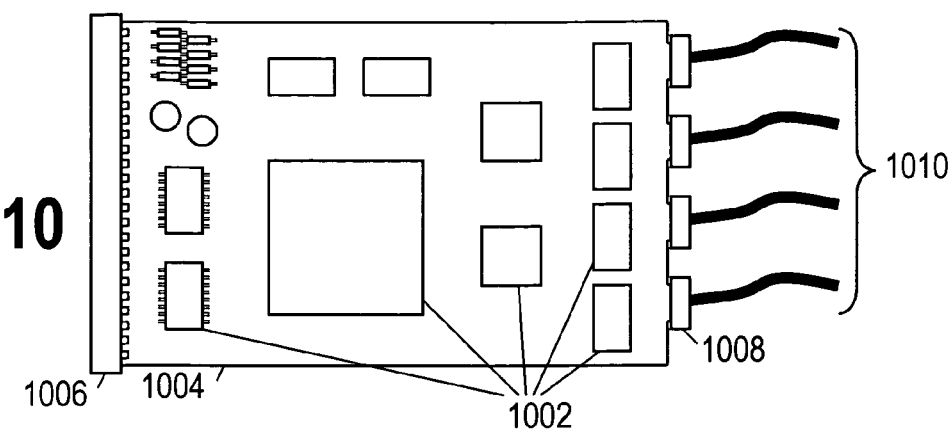
FIG. 10 shows an illustrative circuit card suitable for use at elevated temperatures.

To provide the desired functionality, the chips in a chipset are coupled together electrically. FIG. 10 shows a number of packaged integrated circuit chips 1002 mounted on a circuit card 1004. The circuit card 1004 is shown attached to a connector 1006 suitable for connecting the circuit card 1004 to a tool bus which may be connected to other circuit cards. Also attached to the circuit card 1004 are connectors 1008 suitable for connecting the circuit card to sensors and actuators that may be individually controlled by the circuit card. The circuit card 1004 provides physical support and electrical interconnections for the packaged chips 1002, connectors 1006, 1008, and other components attached to the card.

Each chip package 1002 can take the form of a multi-chip module, i.e., a package having a substrate upon which are mounted multiple integrated circuit die. The substrate provides physical support and electrical interconnections between the multiple die and also between the die and external pins or pads.

Many integrated circuits are subject to performance degradation or failure at moderately elevated temperatures (e.g., 150° C.), while other integrated circuits may continue to perform adequately at such temperatures. In various circuits that may be desirable for long-term installation at moderately elevated temperatures, continuous operation is not necessary. Rather, certain portions of a circuit may need to be accessed only briefly and at infrequent intervals, e.g., nonvolatile program memory may only need to be accessed at power-on and reset events. Voltage references may only be needed at infrequent calibration events. In such circuits, refrigeration efforts may be localized to just that portion of the circuit that requires cooling. Further, the refrigeration may be performed only when the operation of the temperature-sensitive circuits is needed. In such circuits, refrigeration operations may be performed directly on the die or package containing the temperature-sensitive circuitry, greatly reducing the thermal mass that needs to be cooled. Further, since the refrigeration operations may be brief and infrequent, the refrigeration system may be small, and the heat sink may be reduced in size or eliminated. In this manner, the size and power requirements for electronics cooling may be drastically reduced.

Figure 11A:
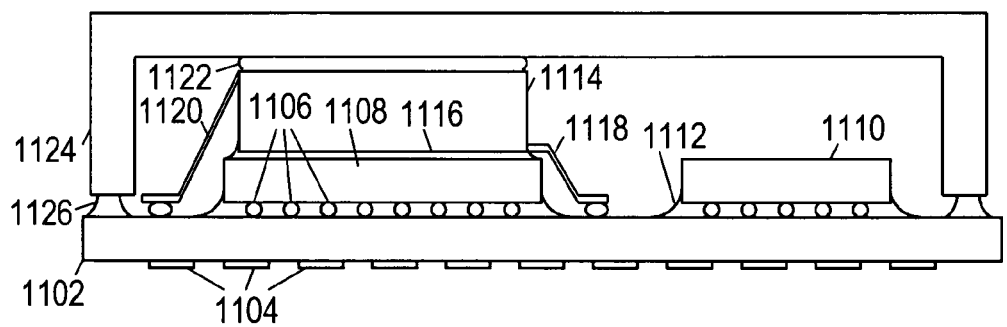
FIGS. 11A and 11B show illustrative embodiments of an electronics package with focused, intermittent cooling.

FIG. 11A shows an illustrative multi-chip module (MCM) having a substrate 1102 with pads 1104 for external electrical connections. Electrical paths and pads may also be provided for internal connections on the other side of substrate 1102. In FIG. 11A, an integrated circuit die 1108 is shown in a "flip chip" configuration. In this configuration, solder balls 1106 are attached to the active surface of the die 1108, and these balls are positioned against mating balls or pads on substrate 1102. The solder balls are partially melted, forming physical, electrically conductive connections. Other dies 1110 may be similarly mounted. A nonconductive adhesive material 1112 may be introduced into the gap between the dies 1108, 1112 and the substrate 1102 to reinforce the physical attachment. Other MCM configurations such as wire bonding may also be used.

In the MCM of FIG. 11A, a Peltier cooler 1114 is mounted on the inactive ("back") surface of die 1108 with a thermally conductive adhesive 1116. A Peltier cooler is comprises a multi-layer sandwich of interleaved metal layers. As current flows from layer to layer, heat is transported from one surface of the cooler to the opposite surface. Electrode 1118 is attached to the cooled (bottom) surface, and electrode 1120 is attached to the heated (top) surface. These electrodes may be bonded to substrate 1102.

Depending on the various parameters for cooling the electronics and the performance of the cooler, a dedicated heat sink may be unnecessary. In the MCM of FIG. 11A, a thermally conductive and deformable material 1122 thermally couples the top surface of the Peltier cooler 1114 to the package cap 1124, which serves a dual purpose as packaging and heat sink. An adhesive bond 1126 attaches cap 1124 to substrate 1102 and seals the package. In one embodiment, the substrate 1102 comprises a ceramic material with patterned metal layers for interconnects. The cap 1124 may be a ceramic, plastic, or metal material.

Figure 11B:
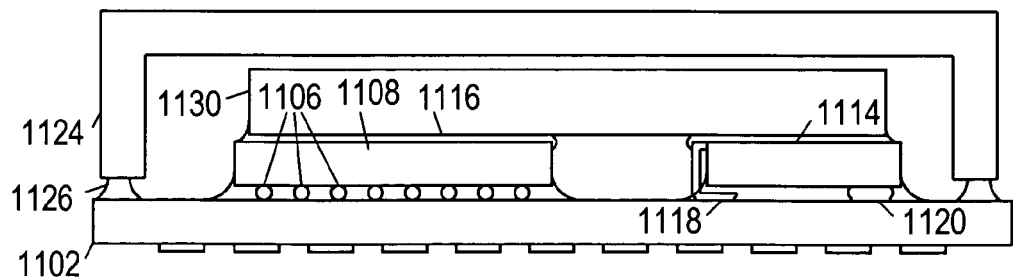

FIG. 11B shows a variant MCM configuration in which the Peltier cooler 1114 is mounted directly on substrate 1102. The Peltier cooler 1114 cools die 1108 indirectly via a thermal conductor 1130 which is bonded to both the cooler 1114 and die 1108 with thermally conductive adhesive.

Die 1108 may include a Flash memory and a voltage reference. Flash memory can generally retain information at temperatures above the point where the read and write circuitry fails. Upon needing to access the Flash memory to retrieve or store data, a controller may energize the Peltier cooler and pause for a predetermined time interval. Once the interval ends, the controller may perform the needed memory accesses and de-energize the cooler. A volatile memory may be used to buffer data traveling to and from the Flash memory, thereby reducing the frequency of accesses to the nonvolatile memory.

Voltage references can be temperature controlled in a similar fashion. That is, a controller may energize the Peltier cooler to temporarily regulate the temperature of a voltage reference, and pause for a predetermined time interval to allow the voltage reference's temperature to stabilize before performing a calibration operation with a voltage reference. The accuracy of the voltage reference may be increased by limiting the temperature range in which it is employed. The controller can de-energize the cooler when the voltage reference is not in use.

The need for cooling may be reduced or eliminated through the use of a different semiconductor technology. Transistors and other integrated circuit components are formed by placing differently-doped regions of silicon in contact with each other to create depletion regions. As the device temperatures increase, thermally excited electrons create stray current carriers in the depletion regions. The stray current carriers cause a leakage current to flow to or from regions that are supposed to be isolated by these depletion regions. The leakage currents increase rapidly as a function of temperature, and at elevated temperatures, the leakage currents may be quite large. Large leakage currents are detrimental for a number of reasons. The leakage currents give rise to additional heat dissipation, which may further raise the temperature and thereby further increase leakage currents. Leakage currents will substantially increase the integrated circuit's power consumption. Leakage currents generally degrade the performance of integrated circuits, and at some temperature the circuits will be rendered inoperable. Finally, leakage currents increase the likelihood of unintentional and undesirable interaction between integrated circuit components. One example of a common interaction is the "latchup" effect, in which a current path forms between different transistors with a runaway effect that leads to large currents that typically can only be stopped by removing power from the circuit.

Rather than relying on die from silicon wafers, integrated circuits may be formed on silicon carbide wafers. Silicon carbide has a larger energy band gap than silicon, making it much more difficult for thermally excited electrons to create stray current carriers. This relative immunity sharply reduces leakage currents in integrated circuits. When patterned with suitably-designed devices, silicon carbide (SiC) wafers may be suitable for constructing electronics that perform well at elevated temperatures. Accordingly, such devices would be suitable for use in high-temperature (e.g., downhole) environments.

Alternatively, integrated circuits may be formed on electrically insulating wafers. By separating the active device regions from the wafer bulk, the size of the depletion regions is greatly reduced, and the leakage currents are reduced correspondingly. Such insulated wafers may include bulk silicon wafers with an insulating layer between the circuitry and the bulk of the wafer substrate. However, in such insulated configurations, there are additional steps required to form and preserve the insulating layer during fabrication of the integrated circuits. Also, there remains in such configurations a capacitive coupling with the wafer bulk that affects power consumption and limits the integrated circuit's operating speed. For downhole application, it may be preferred to use wafers of a bulk insulating material. For example, sapphire is an insulating material which may be formed into single-crystal wafers and provided with a semiconducting surface layer. Sapphire wafers with a thin silicon surface layer are commercially available. When patterned with suitably-designed devices, silicon-on-sapphire (SOS) wafers may be suitable for constructing electronics that perform well at elevated temperatures.

Figure 12:
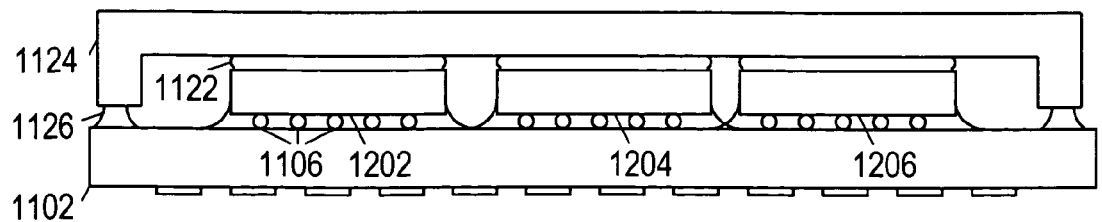
FIG. 12 shows a partitioning of an electronics package suitable for use in a high temperature environment.

FIG. 12 shows a multi-chip module 1102 which may be used to implement a partitioned design. Each die 1202, 1204, 1206, may have a partitioned portion of the overall design, and may be tested prior to construction of the multi-chip module 1102. The overall cost of the design may be greatly reduced due to the enhanced yield rates of each die.

Figure 13:
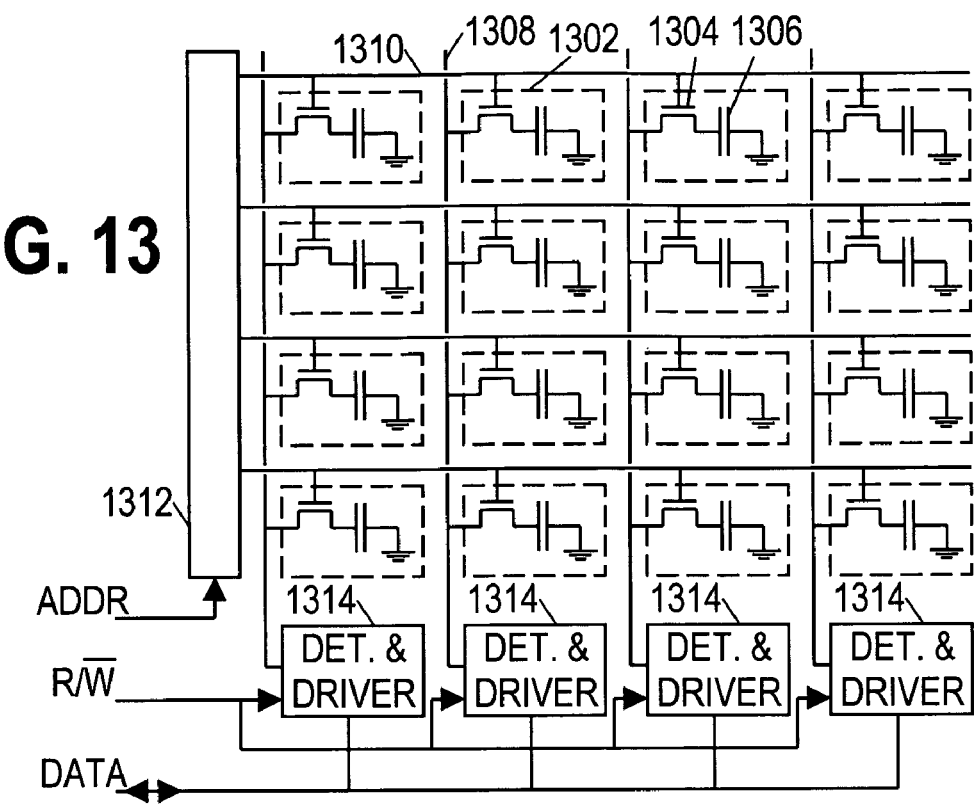
FIG. 13 shows an illustrative analog memory.

Since SiC and SOS technology allows for the creation of devices with minimal leakage currents, SiC and SOS technology may serve as a basis for analog memories. The reduced leakage will allow for extended storage of charge with only minimal degradation due to leakage currents. FIG. 13 shows an illustrative analog memory that includes an array of memory cells 1302. Each memory cell includes an access transistor 1304 and a capacitor 1306. When a row line 1310 is asserted, the access transistors coupled to the asserted row line will couple the capacitor to a corresponding column line 1308. During a storage operation, the column lines charge the capacitor to store an analog value. During a read operation, the capacitor charge is shared with the column line, altering the potential of the column line in a measurable way.

The analog memory receives a digital address signal, a digital read/write signal, and one or more bidirectional analog data signals. A row decoder 1312 asserts the row line indicated by the address signal. One or more detector and driver circuits 1314 receives the read/write signal. When the control signal indicates a read operation, the detector and driver circuits perform a sensing operation on the column lines to measure the charge stored in the analog memory cells made accessible by the assertion of a row line. The analog values are amplified and driven as an output signal on the analog data lines. Thereafter, the detector and driver circuits may recharge the memory cell to the measured values. When the control signal indicates a write operation, the detector and driver circuits buffer the analog data signal values from the analog data bus, and charge the capacitors in the accessible memory cells to the corresponding values.

Although the leakage currents are small, they will not be completely eliminated. Accordingly, some decay of the stored analog values may be expected over time. If the decay rate is sufficiently long, the decay may be measured through the use of reference cells in the analog memory array. One or more selected cells may be used to store predetermined analog values at the same time the rest of the memory array is filled. Thereafter, when the memory is read, the reference cells may be used to measure the decay rates, and the other stored analog values may be compensated accordingly.

If the decay rate is somewhat larger, then each analog memory cell may be periodically refreshed. During a refresh operation, the stored analog value is read, amplified to compensate for an assumed decay rate, and stored back into the memory cell. Reference memory cells may be employed to measure the overall change caused by repeated decay and refresh cycles, so that when the data is finally read, some compensation may be made for accumulated inaccuracies in the refresh operations.

Figure 14:
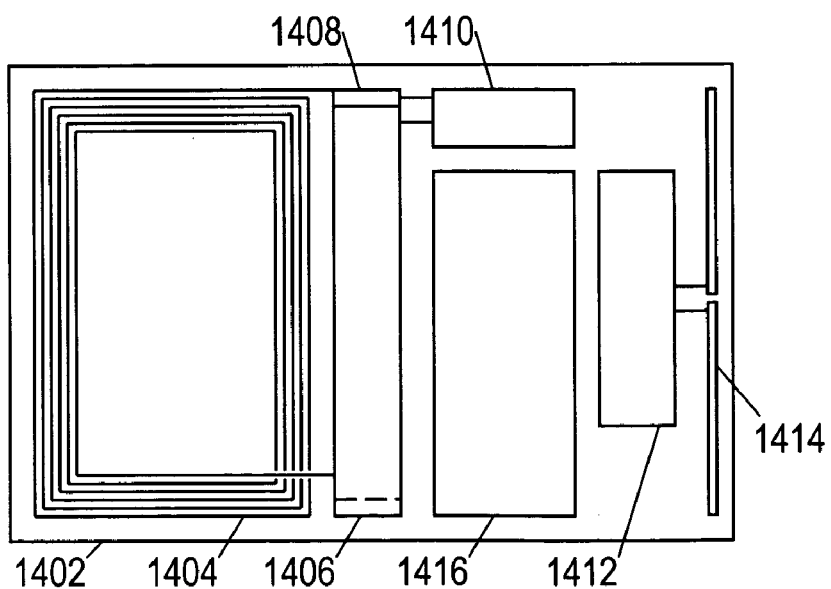
FIG. 14 shows an illustrative tag device.

FIG. 14 shows a tag device 1402 implemented using SiC or SOS technology. When implemented using SiC or SOS technology, such a device may operate in high-temperature environments. The tag device 1402 includes an inductive coil 1404 coupled between the two plates 1406 and 1408 of a capacitor. The inductive coil 1404 is configured to resonate with the capacitor in response to a high-frequency electromagnetic signal. A power circuit 1410 captures power from the resonance and provides power to the other device components. The tag device further includes a transceiver module 1412 and a printed dipole antenna 1414. The transceiver module 1412 is configured to detect commands that may be transmitted to the tag device 1402, and is further configured to respond by transmitting on the dipole 1414.

The tag device may further include a nonvolatile memory module 1416 for storing data. The transceiver 1412 may store received data in response to a detected command. The transceiver may transmit stored data in response to another detected command.

The tag device 1402 may be implemented as a small die measuring (e.g.) less than 5 mm on each side. Rather than being packaged, the tag device may be coated with a passivation layer. When constructed in this manner, each tag device may cost very little. The tag device should be able to survive and operate at extreme pressures and elevated temperatures. Accordingly, tag devices may be added to a fluid flow (e.g., a flow of drilling fluid into a well) as information carriers. As the tag devices pass sensor stations, the tag devices may be activated to receive and store sensor data. Later, as the fluid flow passes a data acquisition center, the tag devices may be activated to transmit their stored data. Each device may be configured to transmit on a different frequency or with a different modulation code, so that multiple devices may be interrogated simultaneously. The tag devices may communicate with the sensor and data acquisition stations using an ultra-wide band (UWB) wireless protocol using frequencies in the 3-10.6 GHz range.

In addition to performing a telemetry transport function, the tag devices may be used as a tracing mechanism to detect fluid flow paths and fluid loss. In the well context, the tag devices may be swept by the fluid as the fluid flows from the well into the formation. A wireline probe passing along the well bore may detect concentrations of tag devices at these fluid loss regions, and indeed, the probe may be able to map faults from the spatial distribution of the tag devices.

In an alternate embodiment, the tag device may include sensors rather than memory. When interrogated, the tag device may transmit its own sensor measurements. Such an embodiment may be useful for locating sensors in locations where wires are not feasible. For example, slip rings on rotating components and wire junctions in hostile environments are primary failure points which could be eliminated with a tag device. Of course wireless communication may be built into other SiC or SOS devices.

Fabrication of memories and other integrated circuits on the surface of SiC and SOS wafers involves a number of steps to deposit and pattern each of a number of material layers that together form the integrated circuit. Patterning of materials may be performed by photolithography. Photolithography involves spinning a light-sensitive photoresist material onto the wafer surface. Next, using precise optical processes, the photoresist material is patterned in the shape of individual circuit components by shining light onto the layer through a pattern on a glass mask, or reticle. The exposed photoresist material is cured and developed, then dissolved areas of the photoresist are rinsed away, leaving the wafer ready for patterned etching or implant doping. The aforementioned processes are generally repeated as each subsequent layer is fabricated.

Typically, the fabrication process begins with the fabrication of individual circuit elements on the wafer surface. Electrical connections between appropriate circuit elements, and electrical isolation between other circuit elements, are then established using alternating layers of appropriately patterned conductors and insulators. The circuit elements and their interconnections are formed using a series of processing steps including ion implantation, thin film deposition, photolithography, selective etching, as well as various cleaning processes.

Increasingly complex integrated circuits utilize an increasing number of circuit elements, which in turn requires both more electrical conduction paths between circuit elements and a greater number of conductor-insulator layers to achieve these paths. The increasing number of layers makes successive layer-to-layer alignment, or registration, more difficult. This issue may be addressed through the use of chemical-mechanical polishing (CMP) processes to re-planarize the surface of the wafer after one or more layers have been fabricated.

The CMP operation generally serves to remove excess coating material, reduce wafer topographical imperfections, and improve the depth-of-focus for photolithography processes through better planarity. The CMP process involves the controlled removal of material on the wafer surface through the combined chemical and mechanical action on the semiconductor wafer of a slurry of abrasive particles and a polishing pad. During the CMP operation, sub-micron-size particles from the associated polishing slurry are used to remove non-planar topographical features and extra coating on the wafer surface.

Figure 15:
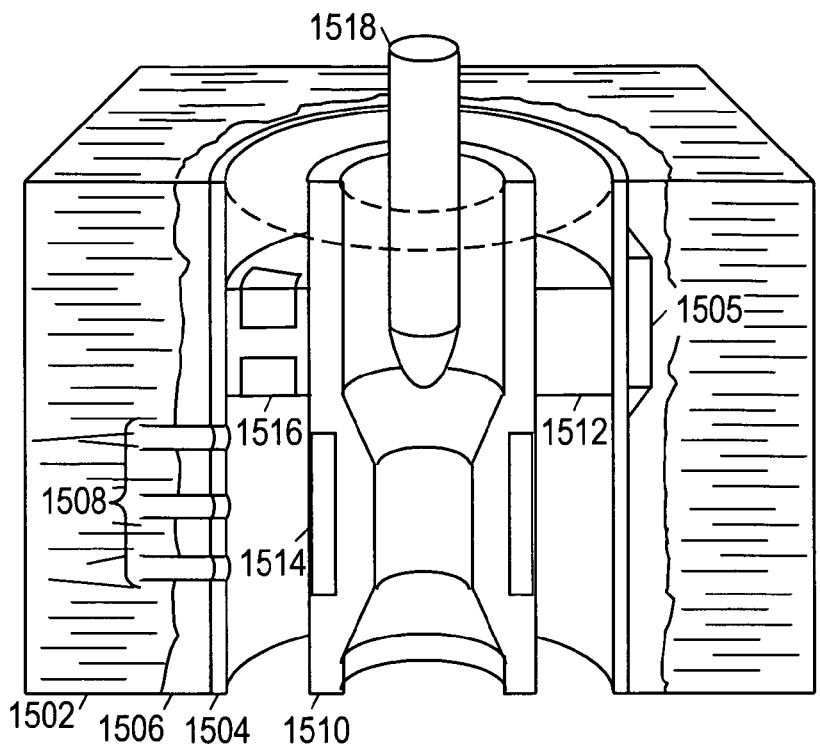
FIG. 15 shows a cut-away view of a production well.

FIG. 15 shows examples of electronics that may be disposed indefinitely in a well. A well in a formation 1502 is lined with casing 1504. The casing may include an instrument package 1505 attached to its exterior. The casing is typically surrounded by cement 1506. Perforations 1508 in the casing and surrounding cement reach the formation and allow fluids to enter the well bore. A production tubing string placed in the casing may include an instrument sub 1510 having an electronics package 1514 located in thickened walls of the instrument sub. The annulus between the production tubing and the casing may be sealed by a packer 1512 to isolate different portions of the well. The packer may include one or more electronics packages 1516. A wireline sonde 1518 or other probe may be inserted and possibly anchored indefinitely within the production tubing. Any of various forms of telemetry may be used to communicate with the surface, including but not limited to radio frequency communication, electrical transport over a wireline cable, and acoustic telemetry. Alternatively, data may be stored for later retrieval.

Figure 16:
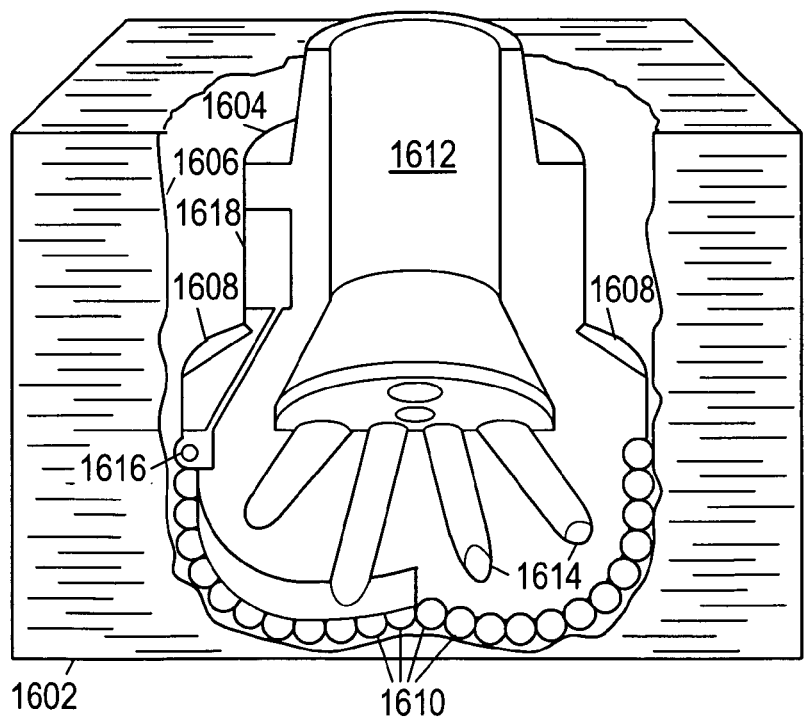
FIG. 16 shows a cut-away view of a drill bit.

An integrated circuit designed for high-temperature operation and implemented using SiC or SOS technology may find a wide variety of applications. FIG. 16 shows an example of an application of high-temperature electronics to drill-bit performance monitoring. A hole is drilled in a formation 1602 by a drill bit 1604 attached to a drill string (not shown here). The drill bit 1604 has multiple blades 1608 tipped with polycrystalline diamond compact (PDC) cutters 1610. As the drill bit 1604 is rotated, the cutters 1610 cut away the rock with a shearing action. An interior passage 1612 conducts drilling fluid to the drill bit 1604, where it then flows through nozzles 1614 between the blades to cool the cutters 1610 and move debris upward away from the drill bit along the annulus around the drill string. The operation of the drill bit involves rock cutting, high-pressure high-volume drilling fluid flow though various orifices, and often friction from rotating bearings, seals and lubricant. Each of these factors generates heat, raising the local temperature of portions of the drill bit at least several tens of degrees above the environment. When drill bits are employed in high temperature downhole environments, their performance is often difficult to monitor. Accordingly, an integrated circuit sensor 1616 is mounted in contact with the back side of one of the cutters 1610. An electronics telemetry package 1618 is coupled to the sensor 1616 to acquire sensor data and transmit it wirelessly to a receiver which may be mounted nearby. Similar techniques may be used to add sensors to a roller cone drill bits.

The sensor 1616 may be configured to measure temperature, strain, vibration, and/or other parameters relating to the performance of the drill bit. Additionally or alternatively, sensors may be provided to monitor parameters associated with the drilling fluid or the surrounding formation. As the drill bit becomes worn, changes in one or more of these parameters may alert the driller that it is time to replace the drill bit or slow the drilling rate. The SiC or SOS circuitry may also be used to condition the measurements by sensors made with other technologies (e.g. piezoelectric strain gauges).

FIG. 17 shows a representative well during drilling operations. A drilling platform 1702 is equipped with a derrick 1704 that supports a hoist 1706. Drilling of oil and gas wells is typically carried out with a string of drill pipes connected together by "tool" joints 1707 so as to form a drill string 1708. The hoist 1706 suspends a kelly 1710 that is used to lower the drill string 1708 through rotary table 1712. Connected to the lower end of the drill string 1708 is a drill bit 1714. The bit 1714 is rotated by rotating the drill string 1708 or by operating a downhole motor near the drill bit. The rotation of the bit 1714 extends the borehole.

Drilling fluid is pumped by recirculation equipment 1716 through supply pipe 1718, through drilling kelly 1710, and down through the drill string 1708 at high pressures and volumes to emerge through nozzles or jets in the drill bit 1714. The drilling fluid then travels back up the hole via the annulus between the exterior of the drill string 1708 and the borehole wall 1720, through the blowout preventer (not specifically shown), and into a mud pit 1724 on the surface. On the surface, the drilling fluid is cleaned and then recirculated by recirculation equipment 1716. The drilling fluid cools the drill bit 1714, carries drill cuttings to the surface, and balances the hydrostatic pressure in the rock formations.

Downhole instrument sub 1726 may be coupled to a telemetry transmitter 1728 that communicates with the surface to provide telemetry signals and receive command signals. A surface transceiver 1730 may be coupled to the kelly 1710 to receive transmitted telemetry signals and to transmit command signals downhole. Alternatively, the surface transceiver may be coupled to another portion of the rigging or to drillstring 1708. One or more repeater modules 1732 may be provided along the drill string to receive and retransmit the telemetry and command signals. The surface transceiver 1730 is coupled to a logging facility (not shown) that may gather, store, process, and analyze the telemetry information.

FIG. 18 shows a representative well during wireline logging operations. The derrick 1804 is not necessary for wireline logging, but is typically present throughout the drilling process. The drill string has been removed from the borehole to allow a sonde 1838 to be lowered by wireline 1840 into the well. Typically, the sonde 1838 is lowered to the bottom of the region of interest and subsequently pulled upward at a constant speed. During the upward trip, the sonde 1838 performs measurements on the formations 1834 adjacent to the borehole as the sonde passes by. The measurement data are communicated to a logging facility 1842 for storage, processing, and analysis. In another embodiment, the sonde may be attached to the end of a continuous tubing (CT) string and moved through the well bore by the coiled tubing.

During the wireline logging operations, the borehole may be filled with a fluid that balances the pressure in the formation and preserves the integrity of the borehole. A number of fluid types may be used, depending on considerations of cost, environment, and formation type. The fluids may be water-based or oil-based, and are generally formulated with weighting agents to customize the fluid density. Sometimes, however, the only fluid may be air (e.g., in hard-rock country).

The electronics employed in the downhole instrument sub 1826 and in the sonde 1838 are configured to operate at the elevated temperatures experienced downhole. Because the electronics are resident in the borehole for only a limited time, the electronics may be shielded from the elevated temperatures by insulation, heat-absorbing materials, and/or active refrigeration. These traditional approaches to configuring electronics for elevated temperature operation have been motivated by the poor performance of many electronics when they are directly exposed to environments with temperatures above 185 Celsius. However, these approaches greatly increase the size of the electronics package, and in the case of active refrigeration, greatly increase the energy consumption by the electronics package. Further, these approaches have not suggested a solution for providing electronics that can remain resident in a well indefinitely. A number of electronics solutions and applications are described herein.

FIG. 19 shows a representative well during production. A well has been drilled through the earth to intersect a fluid reservoir 1902. The well is generally lined with casing 1904 that extends from the well head 1906 to below the fluid reservoir 1902. The casing 1904 is perforated 1908 where it intersects the reservoir to allow fluid to flow into the interior of casing 1904. A blow-out preventer 1910 is attached to the well head 1906 for controlling fluid and gas flows from the well. One or more production tubing strings 1914 may be placed within the casing to transport fluids and gasses to the surface. A packer 1909 may be provided in the annulus between the production tubing 1914 and the casing 1904 to isolate different regions within the well. Various valves (not specifically shown) may be provided to regulate the flow into the production tubing from different regions of the well.

Often, the fluid pressure in the formation will be sufficient to force the fluid to the surface via the production tubing 1914. On the other hand, artificial lift is often employed when the fluid pressure is insufficient. The well of FIG. 19 is a well configured with a "walking beam" pump for artificial lift. In the embodiment shown, a pump body 1912 is affixed to the lower end of a production tubing string 1914 and lowered through the blow-out preventer 1910 to be submerged in the fluid pooling at the bottom of the well. The production tubing is secured to the well head 1906. Also, the pump body 1912 is preferably anchored downhole using standard well servicing techniques. A pump plunger 1916 is affixed to the bottom of a sucker rod string 1918 and lowered through the interior of the production tubing string until it is properly seated in pump body 1912. A packing unit (not specifically shown) in blow out preventer 1910 seals the gap between the sucker rod string 1918 and the blow out preventer 1910, but allows for vertical movement of the tubing 1914. A surface pump unit 1920 reciprocates (cyclically raises and lowers) the sucker rod string 1918, thereby reciprocating the plunger 1916 in the pump body 1912. The reciprocation of the plunger 1916 forces fluid upward through the production tubing string 1914 to the surface. Surface outflow from the production tubing string 1914 is preferably conveyed via a fixed outflow passage 1930 to an above-ground storage tank 1932.

Production wells may be logged with production logging tools that measure various parameters such as (e.g.) flow rates, temperatures, pressures, fluid properties, gamma radiation properties, etc. Production logging may be accomplished with wireline or slickline tools. The tools may use wireline conductors for telemetry, or the tools may be "memory tools" that accumulate data over an extended period.

Though drilling and production have been specifically described above, other contexts for the use of downhole electronics also exist. For example, fluid injection, formation fracturing, seismic mapping, and long term monitoring are also appropriate contexts for the use of downhole electronics. The various tools that have been developed or proposed for application in these varied contexts have to satisfy different requirements, including among other things, high temperature operability, reliability, extended mission life, size limitations, power limitations, and robustness. Wireline tools typically run between 3 to 30 hours on each trip. Logging while drilling (LWD) tools typically run between 2 days to 2 weeks. Memory tools may be run from a few days to a few months. Permanently installed monitoring systems may operate from 3 years to 10 years or more. In each case, improving the suitability of the electronics for high-temperature operation will lengthen the mission life and extend the time period over which the tools can be reused without servicing. The suitability of the electronics for high-temperature operation will also benefit reliability and robustness, and may further reduce or eliminate space or power demands for refrigeration equipment.

It is desirable to provide electronic instruments and controls that may stay resident in wells indefinitely at elevated temperatures. In production wells, the electronics may sense fluid type, flow rate, pressure, temperature, and other parameters. Electronic controls may be provided to regulate flows from different regions of a formation, or to control artificial lift parameters such as the gas injection rate, fluid heating energy, or pumping rates. In test wells, the electronics may include seismic energy sensors for reservoir mapping and monitoring.

Using the above described SOS or SiC transistors, fundamental electronic circuits such as inverters, analog-to-digital converters, digital-to-analog converters, oscillators, voltage references, operational amplifiers, and digital logic gates may operate in high temperatures (e.g., in excess of 200 C.) for an extended period of time. These fundamental electronic circuits may be implemented to build electronic devices that permit a tool to sense, process and store tool component characteristics and environmental characteristics as described above. Some examples of electronic devices that may be implemented to sense, process and store characteristics include: anti-fuse memories, state machines, floating poly-to-poly memories, microprocessors, micro electromechanical systems (MEMS), tag sensors, DC/DC voltage converters, digital memory, analog memory, on-chip transformers, on-chip inductors, on-chip capacitors, on-chip resistors, programmable logic devices (PLDs), mixers, switches, charge pumps and other devices. In addition on-chip transformers may be fabricated by placing magnetically coupled conductive loops (e.g., one current-carrying spiral overlaid on a second current-carrying spiral) on the substrate. On chip inductors may be fabricated from conductive loops or long conductor runs on the substrate. On-chip capacitors may be fabricated from metal-oxide-semiconductor transistors with large gates. Alternatively, on-chip capacitors may be fabricated from closely-spaced metal layers on the substrate. On-chip resistors may be fabricated as biased transistors with appropriate channel resistances.

Figures 20, 21:
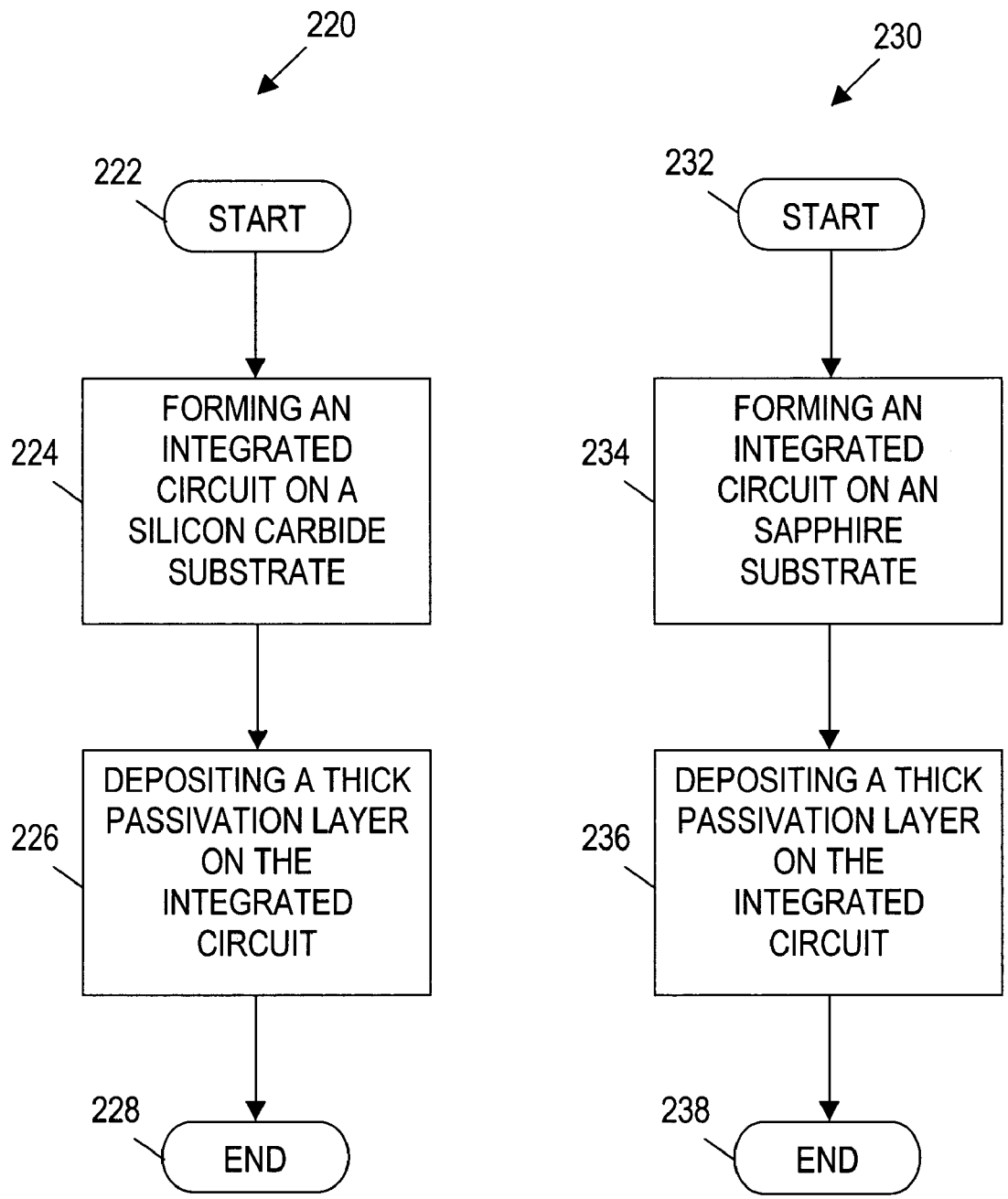
FIG. 20 shows a fabrication method in accordance with embodiments of the invention.
FIG. 21 shows another fabrication method in accordance with embodiments of the invention.

FIG. 20 illustrates a method 220 in accordance with embodiments of the invention. As shown in FIG. 20, the method 220 may start (block 222) and move to forming an integrated circuit on a silicon carbide substrate (block 224). A thick passivation layer may then be deposited on the integrated circuit (block 226), and thus the method 220 may end (block 228).

FIG. 21 illustrates another method 230 in accordance with embodiments of the invention. As shown in FIG. 21, the method 230 may start (block 232) and move to forming an integrated circuit on a sapphire substrate (block 234). A thick passivation layer may then be deposited on the integrated circuit (block 236), and thus the method 230 may end (block 238). The integrated circuit of FIGS. 20 and 21 may be, for example, an oscillator, a logic gate, a comparator, an analog-to-digital converter, a sample and hold circuit, a charge couple delay line and an operational amplifier. The thick passivation layer of FIGS. 20 and 21 may be, for example, a nitride layer or an oxide layer.

Numerous variations and modifications will become apparent to those skilled in the art once the above disclosure is fully appreciated. For example, the disclosed invention embodiments may be applied in elevated temperature environments unrelated to wells. For example, the disclosed embodiments may be employed for automotive engine monitoring, jet engine control, heat-driven power generation, materials processing, and oven controls. In addition, the teachings herein regarding silicon on sapphire technology are also applicable to silicon on spinel technology, simply by replacing the sapphire substrate with a spinel substrate. It is intended that the following claims be interpreted to embrace all such variations and modifications.

What is claimed is:

1. An electronic device comprising:
    an integrated circuit fabricated on a silicon carbide substrate, wherein the integrated circuit comprises at least one circuit selected in the group consisting of: an oscillator, a logic gate, an analog-to-digital converter, a digital-to-analog converter, a sample and hold circuit, a charge-coupled delay line, and an operational amplifier; and
    a passivation layer thicker than about 2 microns, wherein the electronic device is operable for extended periods in an environment with temperatures greater than 200 Celsius.

2. The electronic device of claim 1 wherein the passivation layer comprises a nitride layer.

3. The electronic device of claim 1, further comprising guard rings around portions of the integrated circuit.

4. The electronic device of claim 1 further comprising a seal ring along the periphery of a die associated with the integrated circuit.

5. The electronic device of claim 4, wherein the seal ring's width is at least about twice the width of a cutting lane between dies.

6. The electronic device of claim 1 wherein the integrated circuit includes metal interconnects that limit current density to below a predetermined level when the integrated circuit operates in the elevated temperatures.

7. The electronic device of claim 6, wherein the predetermined level is about $10^4$ A/cm$^2$.

8. The electronic device of claim 1 wherein the integrated circuit is configured to operate at a clock frequency in excess of about 100 MHz.

9. The electronic device of claim 1 wherein the electronic device is configured to continue operating in the environment for at least one week.

10. The electronic device of claim 1 wherein the at least one circuit is configured for use in a unit in the group consisting of: an anti-fuse memory, a state machine, a floating poly-to-poly memory, a microprocessor, a micro electromechanical systems (MEMS), a tag sensor, a DC/DC voltage converter, a digital memory, an analog memory, an on-chip transformer, an on-chip inductor, an on-chip capacitor, an on-chip resistor, an programmable logic device (PLD), a mixer, a switch and a charge pump.

11. The electronic device of claim 1 wherein the electronic device is configured for use in a drill bit, comprising:
a rotating base; and
cutters mounted in the rotating base,
wherein the electronic device is mounted near at least one of the cutters and configured to detect operating parameters of the drill bit.

12. The electronic device of claim 1 wherein the electronic device is configured for use within a multi-chip module and wherein a Peltier cooler disposed within the multi-chip module is configured to intermittently cool the electronic device.

13. The electronic device of claim 1 wherein the electronic device is configured for use in a hybrid circuit having dies that are limited to a size calculated to optimize cost of the hybrid circuit and wherein each die carries an integrated circuit that is a partitioned portion of a larger integrated circuit.

14. The electronic device of claim 1 wherein the electronic device is configured for use in a micro electromechanical system (MEMS) structure that operates as a sensor selected from the group consisting of accelerometers, pressure sensors, gyros, temperature sensors, and thermal arrays.

15. The electronic device of claim 1 wherein the electronic device is configured for use in a tag device that comprises:
a nonvolatile memory; and
an on-chip antenna configurable to wirelessly transmit information stored in the nonvolatile memory.

16. An electronic device comprising:
an integrated circuit fabricated on a sapphire substrate, wherein the integrated circuit comprises at least one circuit in the group consisting of: an oscillator, a logic gate, an analog-to-digital converter, a digital-to-analog converter, a sample and hold circuit, a charge-coupled delay line, and an operational amplifier; and
a passivation layer thicker than about 2 microns, wherein the electronic device operates for an extended period in an environment with a temperature of at least 200 Celsius.

17. The electronic device of claim 16 wherein the passivation layer comprises a nitride layer.

18. The electronic device of claim 16 further comprising guard rings around portions of the integrated circuit.

19. The electronic device of claim 16 further comprising a seal ring that surrounds the integrated circuit.

20. The electronic device of claim 19, wherein the seal ring's width is greater than about twice the width of a cutting lane between dies.

21. The electronic device of claim 16 wherein the integrated circuit includes metal interconnects that limit current density to below a predetermined level when the integrated circuit operates in the elevated temperatures.

22. The electronic device of claim 21, wherein the predetermined level is about $10^4$ A/cm$^2$.

23. The electronic device of claim 16 wherein the integrated circuit is configured to operate at a clock frequency in excess of about 100 MHz.

24. The electronic device of claim 16 wherein the electronic device is configured to continue operating in said environment for at least one week.

25. The electronic device of claim 16 wherein the electronic device is configured for use in a unit in the group consisting of: an anti-fuse memory, a state machine, a floating poly-to-poly memory, a microprocessor, a micro electromechanical systems (MEMS), a tag sensor, a DC/DC voltage converter, a digital memory, an analog memory, an on-chip transformer, an on-chip inductor, an on-chip capacitor, an on-chip resistor, an programmable logic device (PLD), a mixer, a switch and a charge pump.

26. The electronic device of claim 16 wherein the electronic device is configured for use in a drill bit, comprising:
a rotating base; and
cutters mounted in the rotating base,
wherein the electronic device is mounted near at least one of the cutters and configured to detect operating parameters of the drill bit.

27. The electronic device of claim 16 wherein the electronic device is configured for use within a multi-chip module and wherein a Peltier cooler disposed within the multi-chip module is configured to intermittently cool the device.

28. The electronic device of claim 16 wherein the electronic device is configured for use in a hybrid circuit having dies that are limited to a size limit calculated to optimize cost of the hybrid circuit and wherein each die carries an integrated circuit that is a partitioned portion of a larger integrated circuit.

29. The electronic device of claim 16 wherein the electronic device is configured for use in a micro electromechanical system (MEMS) structure that operates as a sensor selected from the group consisting of accelerometers, pressure sensors, gyros, temperature sensors, and thermal arrays.

30. The electronic device of claim 16 wherein the electronic device is configured for use in a tag device that comprises:
a nonvolatile memory; and
an on-chip antenna configurable to wirelessly transmit information stored in the nonvolatile memory.

31. A method of manufacturing a high-temperature circuit, the method comprising:
determining a design for a circuit comprising a substrate of at least one of silicon on sapphire (SOS) or silicon carbide (SiC);
calculating a fabrication cost for each of a plurality of differently partitioned chipsets that implement the circuit design;
identifying one of the differently partitioned chipsets having the minimum fabrication cost; and
fabricating the minimum cost chipset.

32. The method of claim 31, wherein:
the plurality of differently partitioned chipsets have an increasing number of chips; and
the minimum cost chipset is identified when the fabrication cost for a partitioned chipset with a greater number of chips exceeds the fabrication cost of a chipset with a smaller number of chips.

33. The method of claim 31, wherein the fabrication costs include a packaging cost for each chip in the chipset.

34. The method of claim 33, wherein the fabrication costs further include, for each die in the chipset, a wafer fabrication cost divided by an average number of defect-free die per wafer.

35. The method of claim 34, wherein said average number is an estimate based on a defect density and an active die area.

36. The method of claim 31, wherein said circuit design is implemented in SOS alone.

37. The method of claim 31, wherein said circuit design is implemented in SiC alone.

38. An electronic device that comprises:
a sapphire substrate; and
an antenna fabricated on the sapphire substrate and configurable to wirelessly transmit information,
wherein the device operates as a tag device for an extended period in an environment having a temperature greater than about 200 Celsius.

39. The device of claim 38, further comprising:
a nonvolatile memory fabricated on the sapphire substrate.

40. The device of claim 38, further comprising:
a sensor fabricated on the sapphire substrate.

41. The device of claim 38, further comprising:
a transceiver module fabricated on the sapphire substrate, wherein the transceiver module is configured to detect commands transmitted to the tag device, and is further configured to respond to said commands via the antenna.

42. The device of claim 38, further comprising:
a power circuit fabricated on the sapphire substrate, wherein the power circuit is configured to power other device components with power extracted from a high-frequency electromagnetic signal.

43. An electronic device that comprises:
a SiC substrate; and
an antenna fabricated on the SiC substrate and configurable to wirelessly transmit information,
wherein the device operates as a tag device for an extended period in an environment having a temperature greater than about 200 Celsius.

44. The device of claim 43, further comprising:
a nonvolatile memory fabricated on the SiC substrate.

45. The device of claim 43, further comprising:
a sensor fabricated on the SiC substrate.

46. The device of claim 43, further comprising:
a transceiver module fabricated on the SiC substrate, wherein the transceiver module is configured to detect commands transmitted to the tag device, and is further configured to respond to said commands via the antenna.

47. The device of claim 43, further comprising:
a power circuit fabricated on the SiC substrate, wherein the power circuit is configured to power other device components with power extracted from a high-frequency electromagnetic signal.

48. An electronic device that comprises:
a sapphire substrate; and
a ring oscillator fabricated on the sapphire substrate, the oscillator produces an oscillating signal having a frequency indicative of an environmental parameter,
wherein the device operates in an environment having a temperature greater than about 200 Celsius.

49. The device of claim 48, wherein the environmental parameter is temperature.

50. The device of claim 48, further comprising an antenna coupled to the ring oscillator and configured to transmit the oscillating signal.

51. An electronic device that comprises:
a SiC substrate;
a ring oscillator fabricated on the SiC substrate; and
a passivation layer thicker than about 2 microns,
wherein the device operates in an environment having a temperature greater than about 200 Celsius.

52. The device of claim 51, wherein the ring oscillator is configured to produce an oscillating signal having a frequency indicative of an environmental parameter.

53. The device of claim 52, wherein the environmental parameter is temperature.

54. The device of claim 52, further comprising an antenna coupled to the ring oscillator and configured to transmit the oscillating signal.

* * * * *